United States Patent
Kumar et al.

(10) Patent No.: US 12,119,827 B2
(45) Date of Patent: Oct. 15, 2024

(54) GLITCH FILTER WITH RESET CIRCUIT

(71) Applicant: Synopsys, Inc., Mountain View, CA (US)

(72) Inventors: Kailash Kumar, Noida (IN); Prateek Singh, Noida (IN); Akhil Thotli, Andhra Pradesh (IN); Sriram Kumar Jayanthi, Andhra Pradesh (IN); Rahul Gupta, Haryana (IN)

(73) Assignee: Synopsys, Inc., Sunnyvale, CA (US)

( * ) Notice: Subject to any disclaimer, the term of this patent is extended or adjusted under 35 U.S.C. 154(b) by 1 day.

(21) Appl. No.: 18/087,731

(22) Filed: Dec. 22, 2022

(65) Prior Publication Data

US 2024/0213968 A1   Jun. 27, 2024

(51) Int. Cl.
*H03K 19/003* (2006.01)
*H03K 5/1252* (2006.01)
*H03K 17/16* (2006.01)

(52) U.S. Cl.
CPC .......... *H03K 5/1252* (2013.01); *H03K 17/16* (2013.01); *H03K 19/003* (2013.01)

(58) Field of Classification Search
CPC ...... H03K 5/1252; H03K 17/08; H03K 17/16; H03K 17/161; H03K 17/162; H03K 17/165; H03K 19/00346
See application file for complete search history.

(56) References Cited

U.S. PATENT DOCUMENTS

2014/0132326 A1*   5/2014   Kim .................... H03K 5/088
                                                              327/311

* cited by examiner

*Primary Examiner* — Jung Kim
(74) *Attorney, Agent, or Firm* — Patterson + Sheridan, LLP

(57) ABSTRACT

An electric circuit and a method for filtering glitches are described. The electric circuit includes a filter, an inverter circuit, and a reset circuit. The inverter circuit is electrically coupled to an output of the filter. The reset circuit is electrically coupled to the output of the filter. The reset circuit pulls the output of the filter high when an input signal to the electric circuit and the output of the inverter circuit are both low, pulls the output of the filter low when the input signal to the electric circuit and the output of the inverter circuit are both high, and passes the output of the filter when (i) the input signal to the electric circuit is high and the output of the inverter circuit is low or (ii) the input signal to the electric circuit is low and the output of the inverter circuit is high.

14 Claims, 16 Drawing Sheets

GLITCH FILTER WITH RESET CIRCUIT

TECHNICAL FIELD

The present disclosure relates to glitch filters. Specifically, the present disclosure relates to a glitch filter with a reset circuit that allows the glitch filter to properly handle repeated glitches and to properly transition between disabled and enabled modes.

BACKGROUND

A circuit may include a glitch filter that filters out glitches in an input signal to the circuit. During a glitch, the input signal momentarily transitions to a different logical value (e.g., from low to high or from high to low) and then transitions back to the original logical value. The glitch filter may filter out this glitch so that the rest of the circuit, especially the output of the circuit, is not affected by the glitch.

SUMMARY

The present disclosure describe an electric circuit and a method for filtering glitches. According to an embodiment, an electric circuit for filtering glitches includes a filter, an inverter circuit, and a reset circuit. The inverter circuit is electrically coupled to an output of the filter. The reset circuit is electrically coupled to the output of the filter. The reset circuit pulls the output of the filter high when an input signal to the electric circuit and the output of the inverter circuit are both low, pulls the output of the filter low when the input signal to the electric circuit and the output of the inverter circuit are both high, and passes the output of the filter when (i) the input signal to the electric circuit is high and the output of the inverter circuit is low or (ii) the input signal to the electric circuit is low and the output of the inverter circuit is high.

The electric circuit may include a bypass inverter that inverts the input signal to the electric circuit when the filter is disabled and turns off when the filter is enabled. The inverter circuit may include a first inverter electrically coupled to the output of the filter, a second inverter electrically coupled to an output of the first inverter, and a third inverter electrically coupled to an output of the second inverter. An output of the bypass inverter may be electrically coupled to the output of the second inverter. The second inverter may invert the output of the first inverter when the filter is enabled and turn off when the filter is disabled.

The electric circuit may include a synchronizer circuit that electrically disconnects the filter from the reset circuit when the filter is disabled and electrically connects the filter to the reset circuit when the filter is enabled.

The electric circuit may include an input inverter that inverts the input signal to the electric circuit when the filter is enabled. The filter may be electrically coupled to an output of the input inverter. The input inverter may turn off when the filter is disabled.

According to another embodiment, a method for filtering glitches includes pulling, by a reset circuit, an output of a filter high when an input signal and an output of an inverter circuit are both low. The inverter circuit and the reset circuit are electrically coupled to the output of the filter. The method may also include pulling, by the reset circuit, the output of the filter low when the input signal and the output of the inverter circuit are both high and passing the output of the filter when (i) the input signal is high and the output of the inverter circuit is low or (ii) the input signal is low and the output of the inverter circuit is high.

The method may include inverting, by a bypass inverter, the input signal when the filter is disabled and turning off the bypass inverter when the filter is enabled. The inverter circuit may include a first inverter electrically coupled to the output of the filter, a second inverter electrically coupled to an output of the first inverter, and a third inverter electrically coupled to an output of the second inverter. An output of the bypass inverter may be electrically coupled to the output of the second inverter. The method may include inverting, by the second inverter, the output of the first inverter when the filter is enabled and turning off the second inverter when the filter is disabled.

The method may include electrically disconnecting, by a synchronizer circuit, the filter from the reset circuit when the filter is disabled and electrically connecting, by the synchronizer circuit, the filter to the reset circuit when the filter is enabled.

The method may include inverting, by an input inverter, the input signal when the filter is enabled. The filter may be electrically coupled to an output of the input inverter. The method may include turning off the input inverter when the filter is disabled.

According to another embodiment, an electric circuit for filtering glitches includes a filter, an inverter circuit, and a reset circuit. The filter includes a resistor and a capacitor. The inverter circuit is electrically coupled to an output of the filter. The reset circuit includes a first transistor with a gate that receives an inverse of the output of the inverter circuit and a second transistor with a gate that receives an inverse an input signal to the electric circuit. The first transistor and the second transistor are connected in series between the output of the filter and a voltage source. The reset circuit includes a third transistor with a gate that receives the input signal to the electric circuit and a fourth transistor with a gate that receives the output of the inverter circuit. The third transistor and the fourth transistor are connected in series between the output of the filter and ground.

The electric circuit may include a bypass inverter that inverts the input signal to the electric circuit when the filter is disabled and turns off when the filter is enabled. The inverter circuit may include a first inverter electrically coupled to the output of the filter, a second inverter electrically coupled to an output of the first inverter, and a third inverter electrically coupled to an output of the second inverter. An output of the bypass inverter may be electrically coupled to the output of the second inverter.

The electric circuit may include an input inverter that inverts the input signal to the electric circuit when the filter is enabled. The filter may be electrically coupled to an output of the input inverter. The input inverter may turn off when the filter is disabled.

The electric circuit may include a synchronizer circuit that electrically disconnects the filter from the reset circuit when the filter is disabled and electrically connects the filter to the reset circuit when the filter is enabled.

BRIEF DESCRIPTION OF THE DRAWINGS

The disclosure will be understood more fully from the detailed description given below and from the accompanying FIG.s of embodiments of the disclosure. The FIG.s are used to provide knowledge and understanding of embodiments of the disclosure and do not limit the scope of the disclosure to these specific embodiments. Furthermore, the FIG.s are not necessarily drawn to scale.

DETAILED DESCRIPTION

Figure 1:
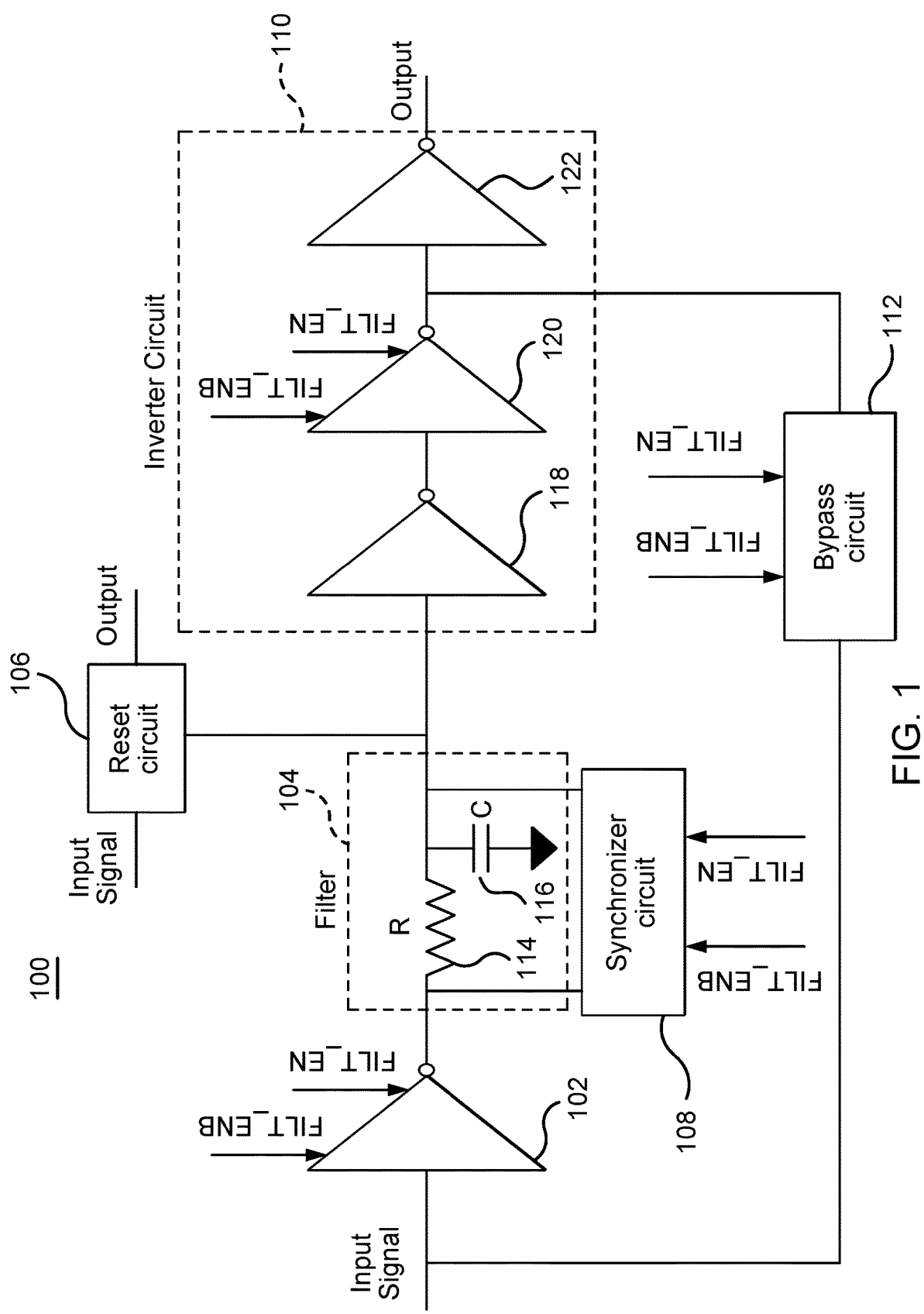
FIG. 1 illustrates an example electric circuit.

Aspects of the present disclosure relate to an improved glitch filter. Glitch filters are used to filter out or remove glitches from an input signal, so that the glitches do not affect other components in a circuit. During glitches, the input signal momentarily transitions to a different logical value (e.g., from low to high or from high to low) and then transitions back to the original logical value. A filter in the glitch filter filters or removes the glitch so that the glitch does not cause undesired or unintended behavior in the output of the circuit.

Existing glitch filters may not operate properly in two scenarios. First, when a glitch in the input signal repeats continuously for a certain period of time, the filter in the glitch filter may filter or remove the first few glitches, but the filter may not be able to filter or remove the remaining glitches. For example, the glitches may cause a capacitor in the filter to charge or discharge. The repeated glitches may cause the capacitor to continue charging or discharging until the filter can no longer filter or remove the glitches. Second, when the glitch filter transitions from being disabled to enabled, the time that it takes for the capacitor in the filter to charge may cause a momentary glitch in the output of the circuit. During this charging period, the circuit may consider the glitch filter to be enabled, but the glitch filter is not actually enabled because the capacitor is still charging.

The present disclosure describes a glitch filter with a reset circuit that allows the glitch filter to properly handle continuous glitches and transitions from a disabled state to an enabled state. The glitch filter includes transistors that pull the output of the filter high or low in between continuous glitches. In this manner, the continuous glitches do not cause the capacitor in the filter of the glitch filter to continue to charge or discharge until the filter can no longer filter or remove glitches from the input signal. Rather, the reset circuit resets the state of the capacitor in between glitches, which allows the filter to continue filtering or removing the continuous glitches. Additionally, the reset circuit may pull the output of the filter high as needed, when the filter transitions from a disabled state to an enabled state. As a result, the reset circuit may cause the output of the filter to be logically high when the capacitor in the filter is charging, which may prevent the momentary glitch in the output of the electric circuit.

Certain embodiments of the present disclosure provide certain technical advantages. For example, the reset circuit allows the glitch filter to properly filter or remove continuous glitches from an input signal. As another example, the reset circuit allows the glitch filter to transition from a disabled state to an enabled state without causing a momentary glitch in the output of the electric circuit. As a result, the glitch filter is more robust than existing glitch filters.

FIG. 1 illustrates an example circuit 100. Generally, the circuit 100 is a glitch filter that filters or removes glitches from an input signal. As seen in FIG. 1, the circuit 100 includes an input inverter 102, a filter 104, a reset circuit 106, a synchronizer circuit 108, an inverter circuit 110, and a bypass circuit 112. The components of the circuit 100 may operate to perform the functions and actions of the glitch filter. In particular embodiments, the reset circuit 106 intervenes in the operation of the circuit 100 when a condition in the filter 104 causes the filter 104 to not properly filter or remove a glitch.

Generally, the circuit 100 includes two paths through which an input signal to the circuit 100 may travel: a filter path and a bypass path. The filter path includes the input inverter 102, the filter 104, and the inverter circuit 110. The bypass path bypasses the filter 104 and includes the bypass circuit 112 and the inverter circuit 110. When the glitch filter is enabled, the input signal to the circuit 100 travels through the filter path. When the glitch filter is disabled, the input signal to the circuit 100 travels through the bypass path. A filter enable signal (FILT_EN) and a filter disable signal (FILT_ENB) are used to enable and disable the glitch filter. When the glitch filter is enabled, the filter enable signal (FILT_EN) is logic high and the filter disable signal (FILT_ENG) is logic low. When the glitch filter is disabled, the filter enable signal (FILT_EN) is logic low and the filter disable signal (FILT_ENB) is logic high.

The input inverter 102 inverts the input signal to the circuit 100. As seen in FIG. 1, the input inverter 102 receives the input signal to the circuit 100, the filter enable signal (FILT_EN), and the filter disable signal (FILT_ENB). When the glitch filter is enabled, the input inverter 102 inverts the input signal to the circuit 100 and outputs the inverted input signal to the filter 104. When the glitch filter is disabled, the input inverter 102 becomes effectively an open circuit, which prevents a signal from passing through the input inverter 102 to the filter 104.

The filter 104 is electrically coupled to the output of the input inverter 102. The filter 104 may be any suitable filter that filters or removes glitches from a signal. During a glitch, the signal may momentarily transition to a different logic state and then transition back to the original logic state. For example, if a logic low signal encounters a glitch, the logic low signal may momentarily transition to logic high and then transition back to a logic low. The filter 104 may filter or remove the momentary logic high signal. As seen in FIG. 1, the filter 104 includes a resistor 114 and a capacitor 116. The resistor 114 is electrically coupled to the capacitor 116 and the output of the filter 104. The resistor 114 receives the output of the input inverter 102. The resistor 114 and the capacitor 116 may operate to filter or remove a glitch in the output of the input inverter 102. For example, the capacitor 116 may charge or discharge to counteract a momentary glitch. As a result, the glitch may not be seen at the output of the filter 104.

The filter 104 may encounter certain issues when filtering signals. For example, if a signal encounters a series of continuous glitches, then the series of continuous glitches may cause the capacitor 116 to charge or discharge to such an extent so as to affect the output of the circuit 100. Stated differently, the continuous glitches may cause the capacitor 116 to charge or discharge to such an extent that the output of the filter 104 is recognized by the inverter circuit 110 as flipping logical states. As a result, the output of the inverter circuit 110 may also flip logical states, which causes the output of the circuit 100 to flip logical states. In this situation, the filter 104 has failed to filter the series of continuous glitches.

As another example, when the glitch filter transitions from a disabled to an enabled state and the signal received by the filter 104 is a logic high, the capacitor 116 may begin charging. It may take a period of time for the capacitor 116 to charge to a sufficient voltage such that the inverter circuit 110 recognizes the output of the filter 104 as a logic high signal. During this charging time, the inverter circuit 110 may recognize the output of the filter 104 as a logic low signal, which causes the output of the inverter circuit 110 and the output of the circuit 100 to be set at an incorrect value. After the capacitor 116 charges, the inverter circuit 110 may recognize the output of the filter 104 as a logic high signal, and the output of the inverter circuit 110 and the output of the circuit 100 may be set at the correct values. Thus, the charging period creates a glitch in the output of the circuit 100.

The reset circuit 106 intervenes in the operation of the circuit 100 to counteract the effect of continuous glitches and the effect of the charging period when the filter 104 transitions from the disabled state to the enabled state. As seen in FIG. 1, the reset circuit 106 receives the input signal to the circuit 100 and the output signal of the circuit 100. The reset circuit 106 is also electrically coupled to the output of the filter 104. Generally, the reset circuit 106 pulls the output of the filter 104 to logic high or logic low when the input signal to the circuit 100 and the output of the circuit 100 match. For example, when the input signal to the circuit 100 and the output of the circuit 100 are both logic high, the reset circuit 106 may pull the output of the filter 104 to logic low. As another example, when the input signal to the circuit 100 and the output of the circuit 100 are both logic low, the reset circuit 106 may pull the output of the filter 104 to logic high. When the input signal to the circuit 100 and the output of the circuit 100 do not match, the reset circuit 106 is disabled and passes the output of the filter 104. By pulling the output of the filter 104 to logic high or logic low in certain instances, the reset circuit 106 counteracts the effects of continuous glitches and the effects of the charging period when the filter 104 transitions to the enabled state.

The synchronizer circuit 108 connects to the input and the output of the filter 104. The synchronizer circuit 108 also receives the filter enable signal (FILT_EN) and the filter disable signal (FILT_ENB). Generally, the synchronizer circuit 108 connects and disconnects the filter 104 from the circuit 100 depending on whether the glitch filer is enabled or disabled. For example, when the glitch filter is enabled, the synchronizer circuit 108 connects the resistor 114 and the capacitor 116 to the circuit 100. When the glitch filter is disabled, the synchronizer circuit 108 disconnects the resistor 114 and the capacitor 116 from the circuit 100. The synchronizer circuit 108 may disconnect the resistor 114 and the capacitor 116 in any suitable manner. For example, the synchronizer circuit 108 may disconnect the resistor 114 by closing a switch that creates a short circuit across the resistor 114. The synchronizer circuit 108 may disconnect the capacitor 116 by opening a switch that creates an open circuit before or after the capacitor 116. By connecting or disconnecting the resistor 114 and the capacitor 116 based on whether the glitch filter is enabled or disabled, the synchronizer circuit 108 synchronizes the charging or discharging of the capacitor 116 with the enabling and disabling of the glitch filter.

The inverter circuit 110 inverts an output of the filter 104 or an output of the bypass circuit 112. As seen in FIG. 1, the inverter circuit 110 is electrically coupled to the output of the filter 104 and to the output of the bypass circuit 112. The inverter circuit 110 includes inverters 118, 120, and 122. The inverters 118, 120, and 122 are connected in series with one another. The inverter 118 receives and inverts the output of the filter 104. The inverter 120 may be enabled or disabled when the glitch filter is enabled or disabled using the filter enable signal (FILT_EN) and the filter disable signal (FILT_ENB). When the glitch filter is enabled, the inverter 120 inverts the output of the inverter 118. When the glitch filter is disabled, the inverter 120 becomes effectively an open circuit. The inverter 122 inverts the output of the inverter 120 or the output of the bypass circuit 112 to produce the output of the circuit 100. When the glitch filter is enabled, the inverter 122 inverts the output of the inverter 120. When the glitch filter is disabled, the inverter 122 inverts the output of the bypass circuit 112.

The bypass circuit 112 processes the input signal to the circuit 100 when the glitch filter is disabled. As seen in FIG. 1, the bypass circuit 112 may receive the filter enable signal (FILT_EN) and the filter disable signal (FILT_ENB) that indicate to the bypass circuit 112 when the glitch filter is enabled or disabled. When the glitch filter is enabled, the bypass circuit 112 may become effectively an open circuit so that a signal does not pass through the bypass circuit 112. When the glitch filter is disabled, the bypass circuit 112 may process the input signal to the circuit 100. In particular embodiments, the bypass circuit 112 inverts the input signal to the circuit 100. As a result, when the glitch filter is disabled, the bypass circuit 112 inverts the input signal to the circuit 100 and then the inverter 122 inverts the output of the bypass circuit 112, which causes the output of the circuit 100 to effectively be the input signal to the circuit 100.

Figure 2:
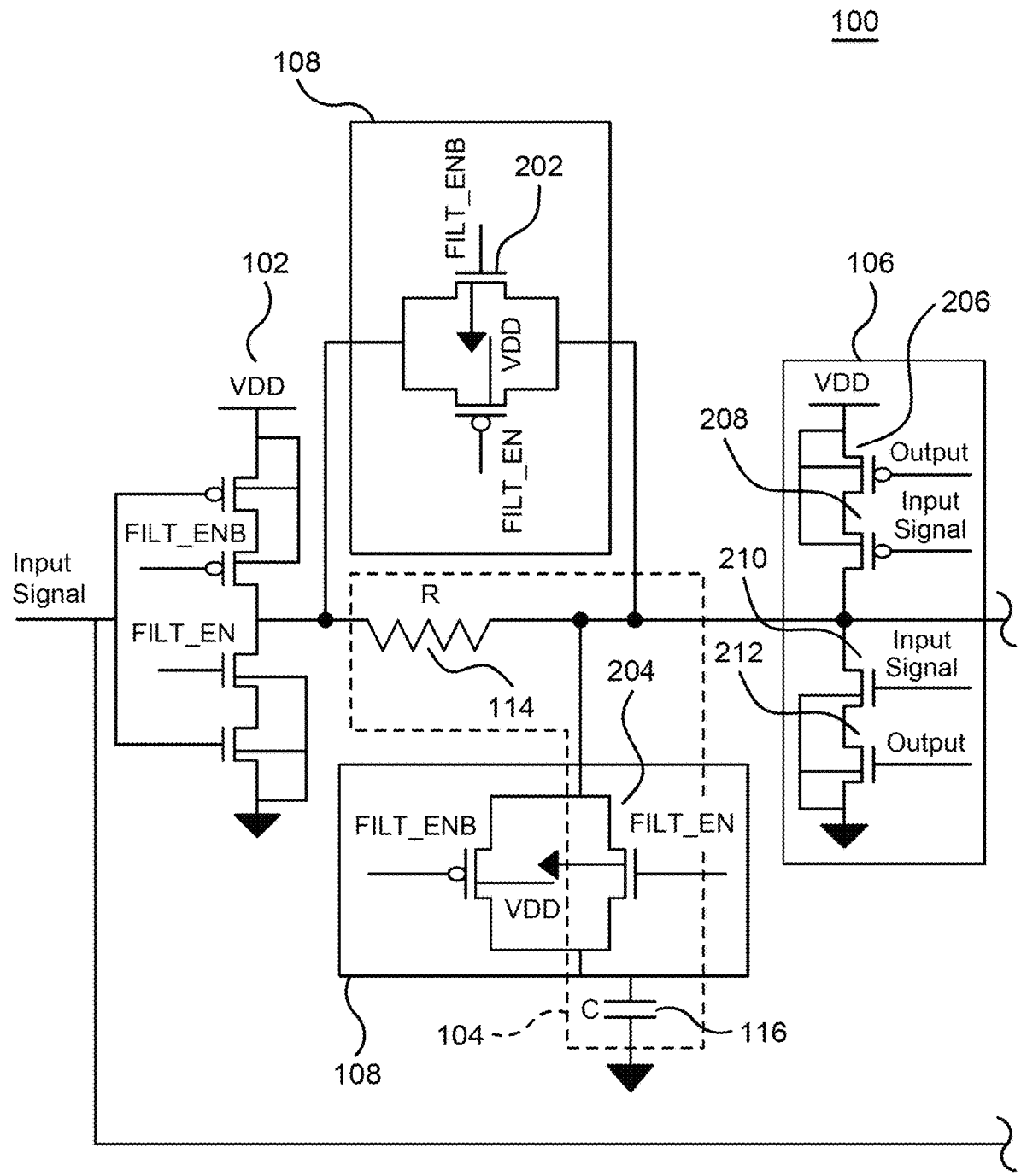
FIG. 2 illustrates the electric circuit of FIG. 1.
Figure 2:
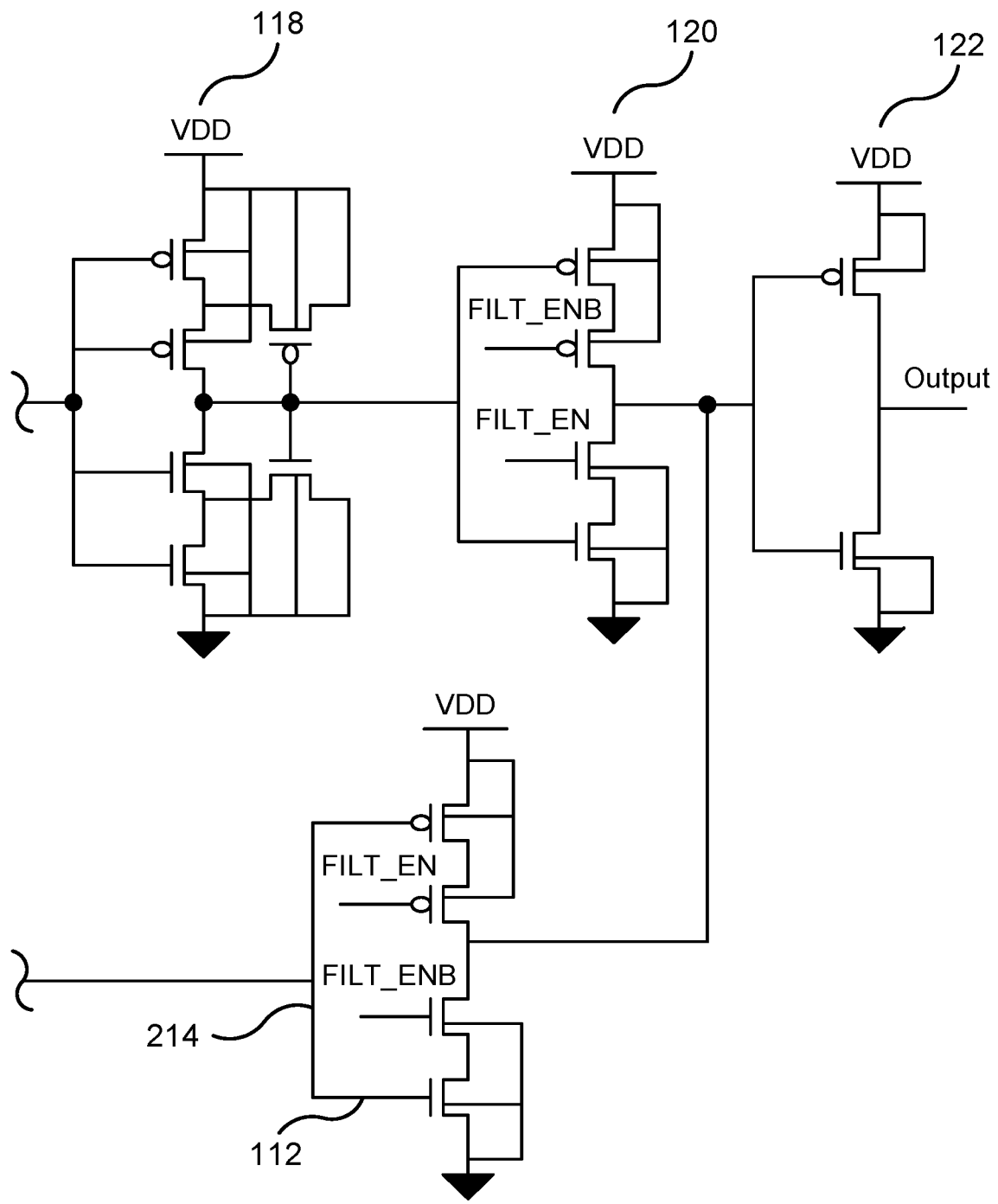

FIG. 2 illustrates the electric circuit 100 of FIG. 1. Generally, FIG. 2 shows the structure of some of the components of the circuit 100.

The input inverter 102 receives the input signal to the circuit 100, the filter enable signal (FILT_EN), and the filter disable signal (FILT_ENB). The input inverter 102 includes a series of transistors that are controlled by the input signal to the circuit 100, the filter enable signal (FILT_EN), and the filter disable signal (FILT_ENB). Generally, when the glitch filter is enabled, the input inverter 102 inverts the logic state of the input signal to the circuit 100. When the glitch filter is disabled, the input inverter 102 effectively becomes an open circuit.

The synchronizer circuit 108 includes a switch 202 and a switch 204. The switch 202 and the switch 204 are controlled by the filter enable signal (FILT_EN) and the filter disable signal (FILT_ENB). The switch 202 is electrically coupled in parallel across the resistor 114. The switch 204 is electrically coupled in series with the capacitor 116. When the glitch filter is enabled, the switch 202 opens to become an open circuit across the resistor 114, which causes signals to travel through the resistor 114. Additionally, the switch 204 closes to become a closed circuit which allows signals to travel to the capacitor 116. When the glitch filter is disabled, the switch 202 closes to become a closed short circuit across the resistor 114, which causes signals to travel through the switch 202 rather than the resistor 114. Additionally, the switch 204 opens to become an open circuit, which prevents signals from traveling to the capacitor 116. Thus, the switches 202 and 204 connect and disconnect the resistor 114 and the capacitor 116 based on when the glitch filter is enabled or disabled.

The reset circuit 106 includes a series of transistors 206, 208, 210, and 212. The transistors 206 and 208 are electrically connected to each other in series between the output of the filter 104 and a voltage source (VDD). The transistors 210 and 212 are electrically coupled in series between the output of the filter 104 and ground. The transistor 206 receives the output of the circuit 100 at a gate of the transistor 206. The transistor 208 receives the input signal to the circuit 100 at the gate of the transistor 208. The transistor 210 receives the input signal to the circuit 100 at the gate of the transistor 210. The transistor 212 receives the output of the circuit 100 at the gate of the transistor 212. As a result, when the input signal to the circuit 100 and the output of the circuit 100 are both logic low, the transistor 206 and the transistor 208 turn on and pull the output of the filter 104 to logic high or a voltage of the voltage source (VDD). When the input signal to the circuit 100 and the output of the circuit 100 are both logic low, the transistor 210 and the transistor 212 turn on and pull the output of the filter 104 to logic low. When one of the input signal to the circuit 100 or the output of the circuit 100 is logic high and the other is logic low, the reset circuit 106 is turned off and passes the output of the filter 104.

Each of the inverters 118, 120, and 122 includes multiple transistors that are arranged to invert a signal received at the inverters 118, 120 and 122. The transistors in the inverter 118 invert the output of the filter 104. The transistors in the inverter 120 invert the output of the inverter 118 when the glitch filter is enabled. The inverter 120 receives the output of the inverter 118, the filter enable signal (FILT_EN), and the filter disable signal (FILT_ENB). When the glitch filter is disabled, the inverter 120 becomes effectively an open circuit. The transistors of the inverter 122 invert the output of the inverter 120 when the glitch filter is enabled. When the glitch filter is disabled, the inverter 122 inverts the output of the bypass circuit 112.

The bypass circuit 112 includes a bypass inverter 214. As seen in FIG. 2, the bypass inverter 214 receives the input signal to the circuit 100, the filter enable signal (FILT_EN), and the filter disable signal (FILT_ENB). When the glitch filter is enabled, the bypass inverter 214 becomes effectively an open circuit. When the glitch filter is disabled, the bypass inverter 214 inverts the input signal to the circuit 100. Additionally, the inverter 122 inverts the output of the bypass inverter 214, which causes the output of the circuit 100 to be the input signal to the circuit 100.

Figure 3:
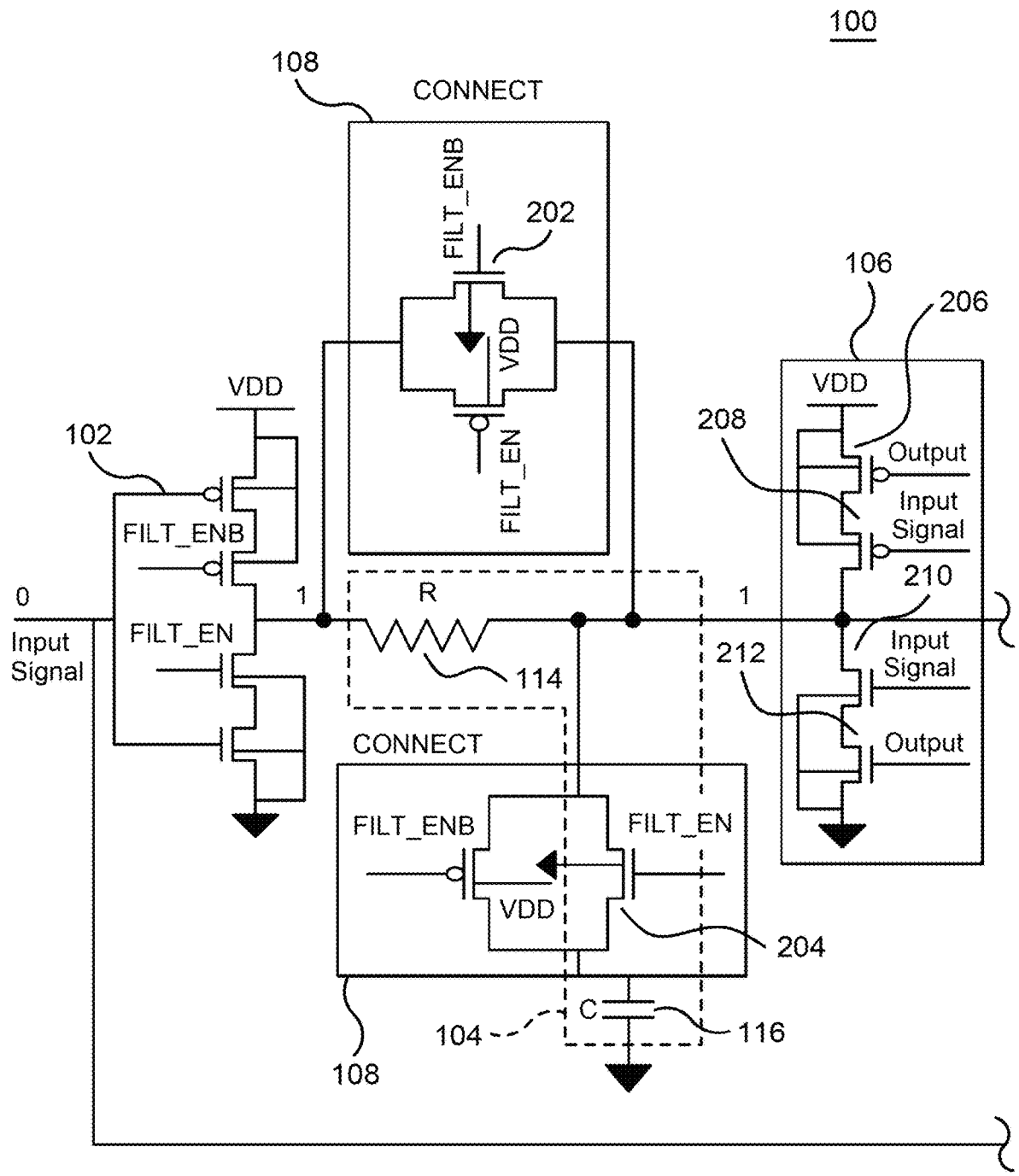
FIG. 3 illustrates a steady state operation of the electric circuit of FIG. 1.
Figure 3:
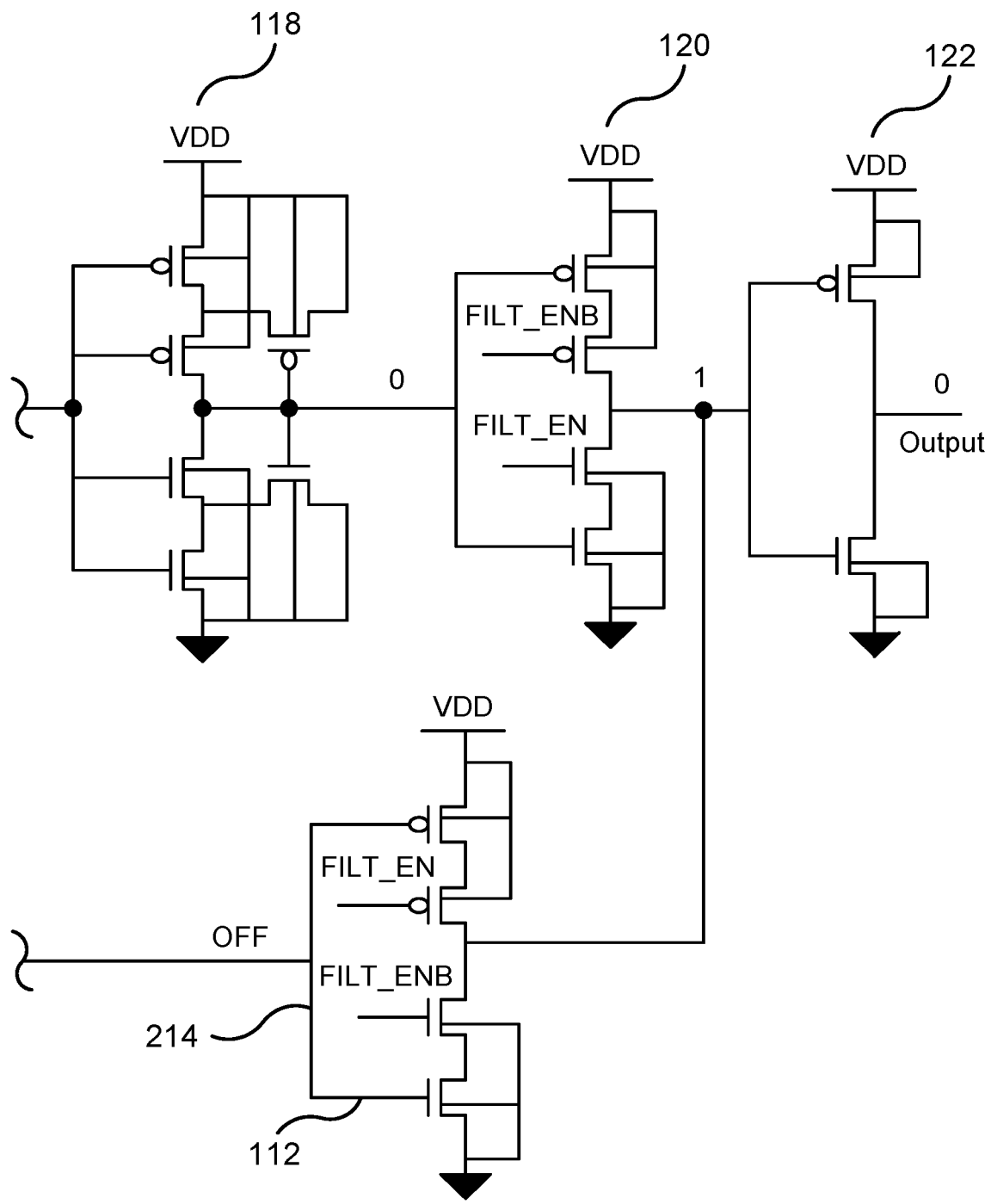

FIG. 3 illustrates a steady state operation of the electric circuit 100 of FIG. 1. Generally, FIG. 3 shows the operation of the circuit 100 when the glitch filter is enabled (e.g., when FILT_EN=1 and FILT_ENB=0). As seen in FIG. 3, when the glitch filter is enabled, the switches 202 and 204 of the synchronizer circuit 108 connect the resistor 114 and the capacitor 116 to the circuit 100. Additionally, the bypass inverter 214 is turned off and is effectively an open circuit.

The input signal to the circuit 100 in the example of FIG. 3 is a logic low (0). The input inverter 102 inverts the input signal to the circuit 100 and outputs a logic high (1). The output of the filter 104 is also a logic high (1). The inverter 118 inverts the output of the filter 104 and produces a logic low (0). The inverter 120 inverts the output of the inverter 118 and produces a logic high (1). The inverter 122 inverts the output of the inverter 120 and produces a logic low (0). As a result, the input signal to the circuit 100 and the output of the circuit 100 are both logic low (0), and the transistor 206 and the transistor 208 of the reset circuit 106 are turned on and pull the output of the filter 104 to logic high (1).

Figure 4:
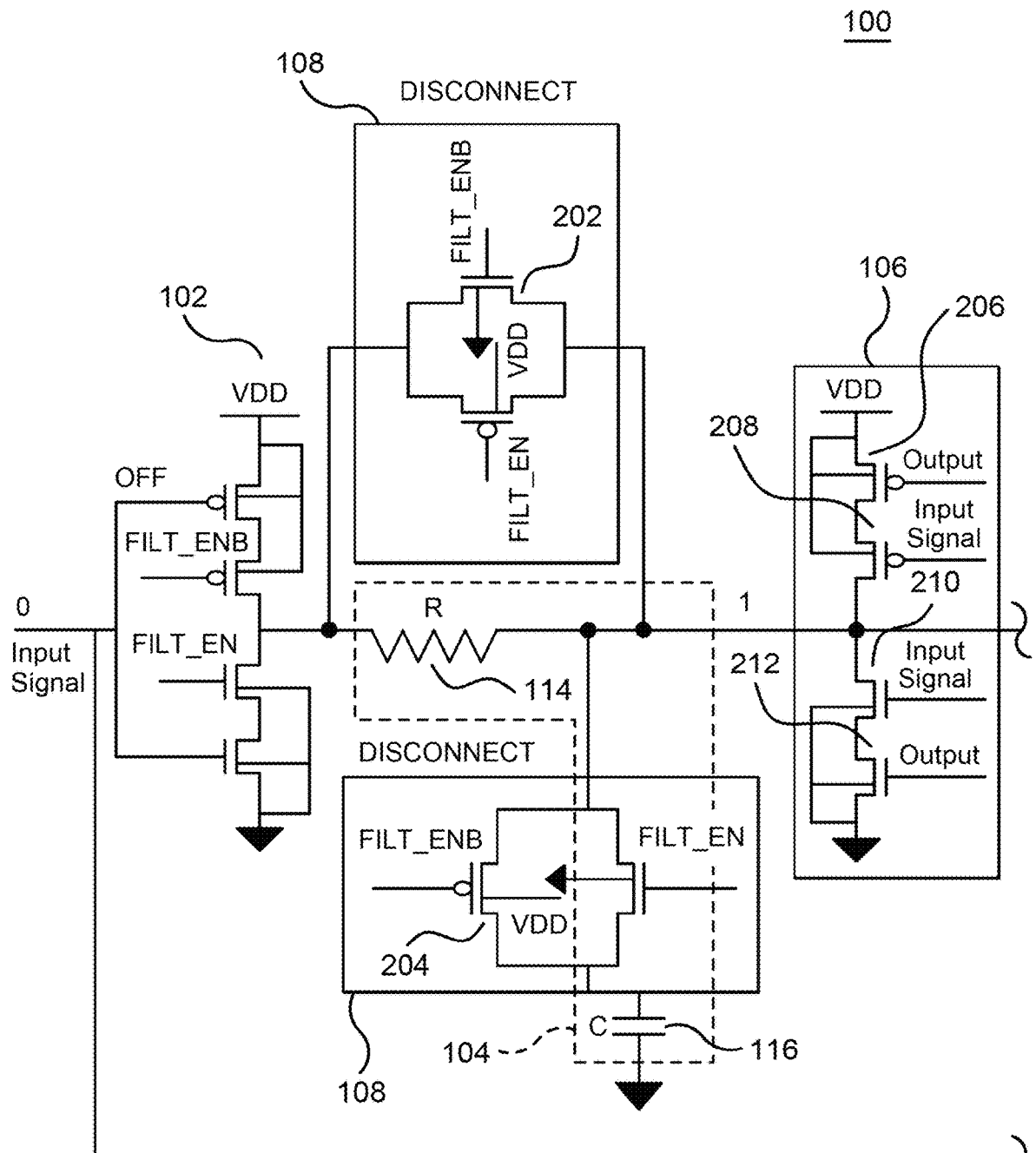
FIG. 4 illustrates a steady state operation of the electric circuit of FIG. 1.
Figure 4:
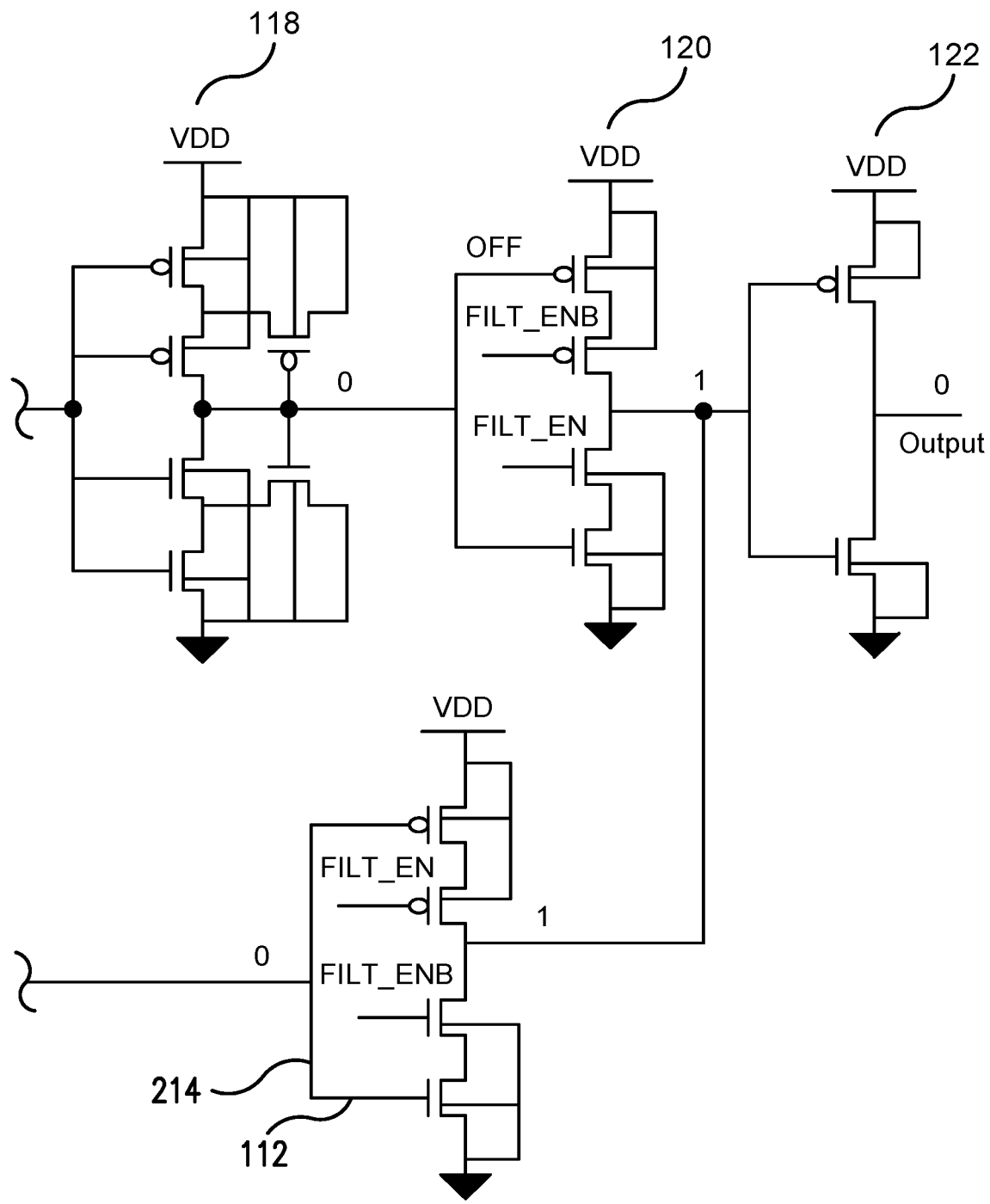

FIG. 4 illustrates a steady state operation of the electric circuit 100 of FIG. 1. Generally, FIG. 4 shows the steady state operation of the circuit 100 when the glitch filter is disabled (e.g., when FILT_EN=0 and FILT_ENB=1). As see in FIG. 4, when the glitch filter is disabled, the switches 202 and 204 of the synchronizer circuit 108 disconnect the resistor 114 and the capacitor 116 from the circuit 100. Additionally, the input inverter 102 and the inverter 120 are turned off and become effectively open circuits.

In the example of FIG. 4, the input signal to the circuit 100 is a logic low (0). Because the input inverter 102 is turned off, the input signal to the circuit 100 travels to the bypass circuit 112. The bypass inverter 214 inverts the input signal to the circuit 100 and produces a logic high (1). The inverter 122 inverts the output of the bypass inverter 214 and produces a logic low (0). As a result, the input signal to the circuit 100 and the output to the circuit 100 are both logic low (0). Because the input signal to the circuit 100 and the output of the circuit 100 are both logic low (0), the transistor 206 and the transistor 208 of the reset circuit 106 turn on and pull the output of the filter 104 to logic high (1) or the voltage of the voltage source (VDD).

The inverter 118 inverts the output of the filter 104 and produces a logic low (0). Because the inverter 120 is turned off, the inverter 120 does not invert the output of the inverter 118.

Figure 5:
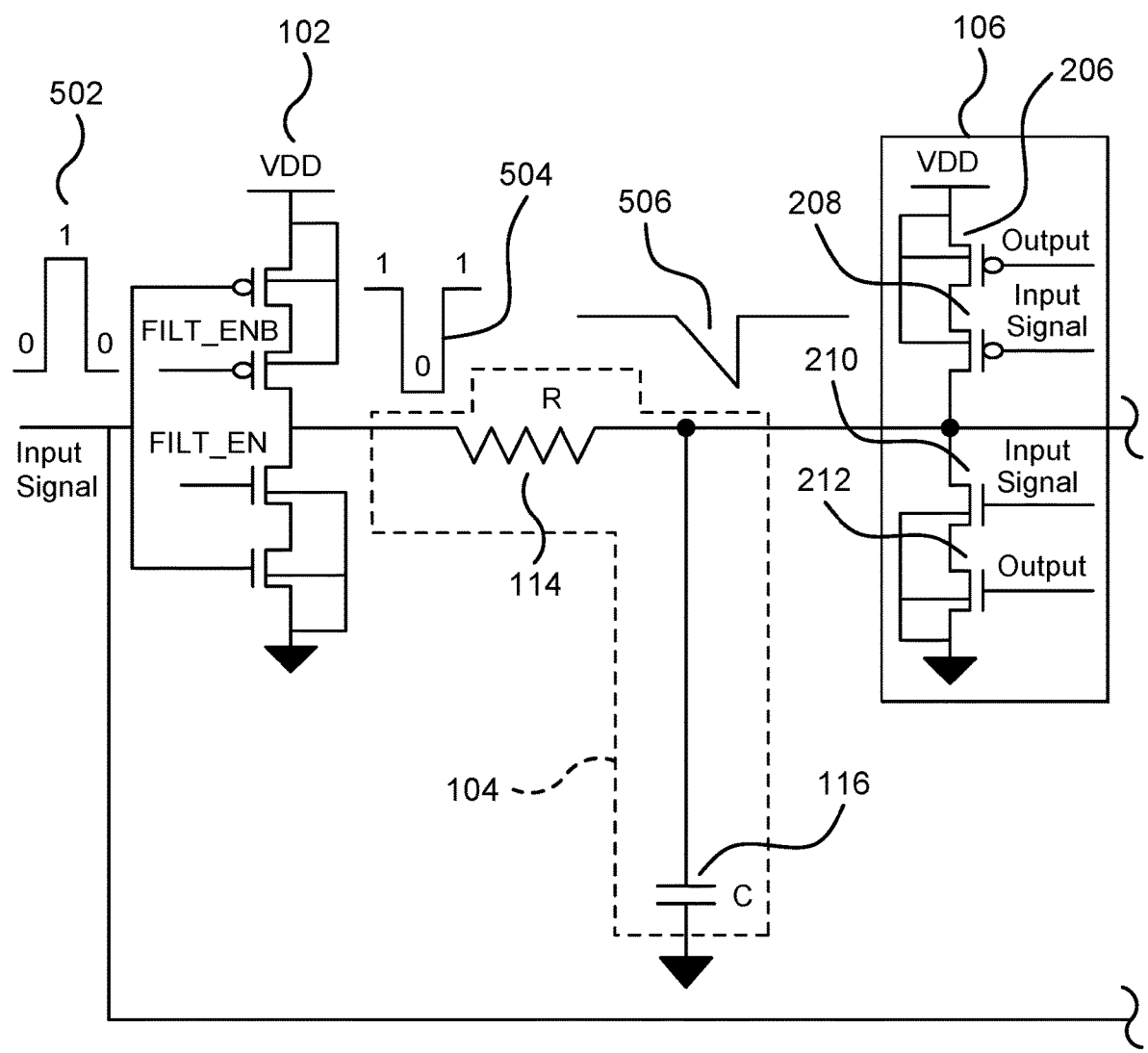
FIG. 5 illustrates glitch filtering using the electric circuit of FIG. 1.
Figure 5:
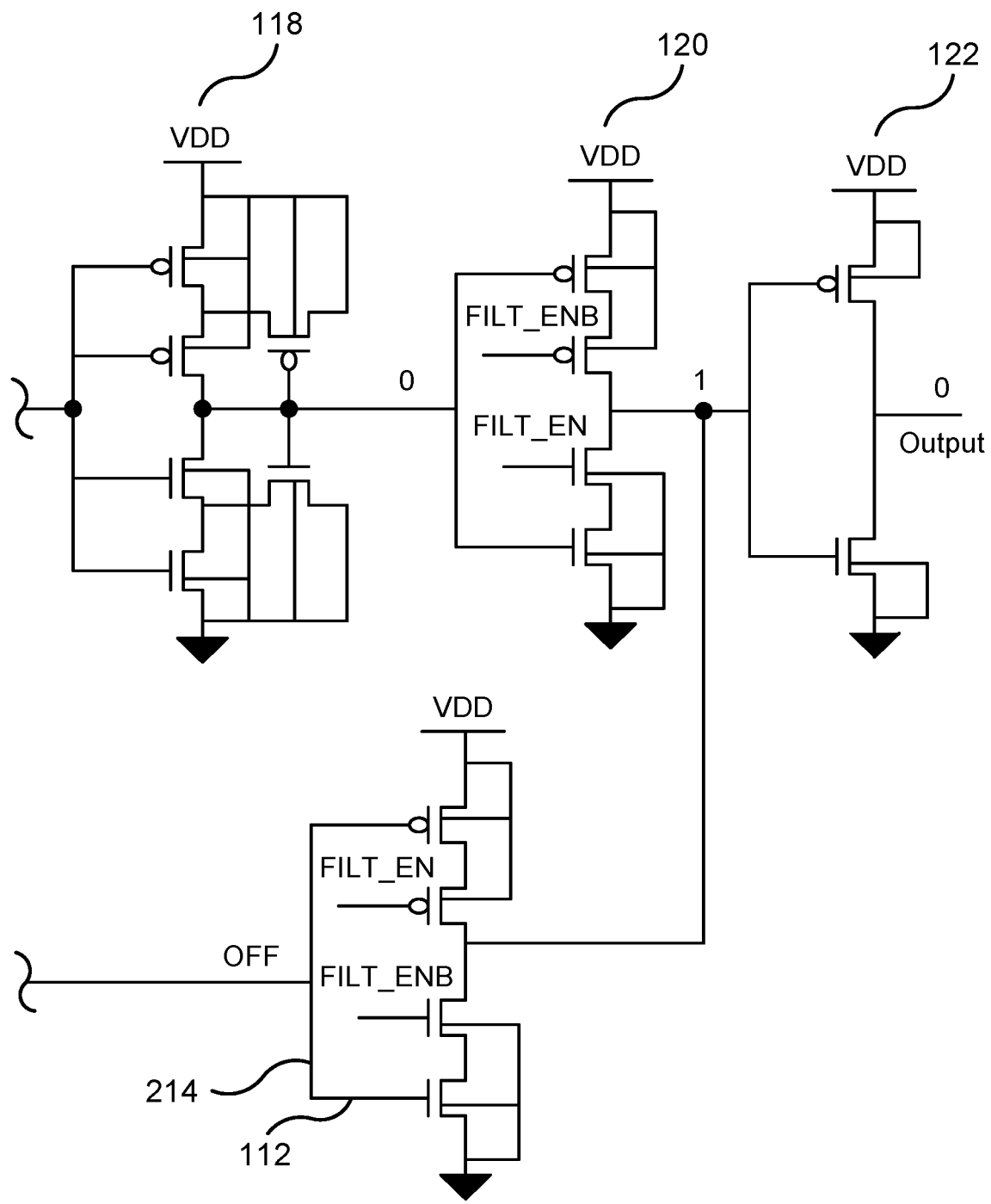

FIG. 5 illustrates glitch filtering using the electric circuit 100 of FIG. 1. For clarity, the synchronizer circuit 108 has not been illustrated in FIG. 5, and the absence of the synchronizer circuit 108 in FIG. 5 should not be interpreted as the removal of the synchronizer circuit 108 from the electric circuit 100 in FIG. 5. As seen in FIG. 5, glitch filtering occurs when the glitch filter is enabled (e.g., when FILT_EN=1 and FILT_ENB=0). The input inverter 102 and the inverter 120 are turned on and the bypass inverter 214 is turned off when the glitch filter is enabled, which causes the input signal to the circuit 100 to pass through the filter 104.

As seen in FIG. 5, the input signal to the circuit 100 may experience a glitch 502. The glitch 502 may cause the input signal to the circuit 100 to momentarily transition from a logic low (0) to a logic high (1) and then transition back to the logic low (0). The input inverter 102 inverts the input signal to the circuit 100 and produces a logic high (1) with a glitch 504. The glitch 504 causes the signal to momentarily transition from the logic high (1) to the logic low (0) and then transition back to the logic high (1).

The glitch 504 causes the capacitor 116 to discharge. As seen in FIG. 5, the output of the filter 104 includes a dip 506 when the capacitor 116 discharges as a result of the glitch 504. The dip 506 may not be sufficient to cause the inverter 118 to recognize a transition in logic state. As a result, the inverter 118 treats the output of the filter 104 as a consistently logic high (1). The inverter 118 inverts the output of the filter 104 to produce a logic low (0). The inverter 120 inverts the output of the inverter 118 to produce a logic high (1). The inverter 122 inverts the output of the inverter 120 to produce a logic low (0) as the output of the circuit 100. Thus, as a result of the filter 104, the glitch 502 in the input signal to the circuit 100 is not seen in the output of the circuit 100.

When the glitch 502 occurs in the input signal to the circuit 100, the input signal to the circuit 100 does not match the output of the circuit 100. Specifically, the input signal to the circuit 100 is a logic high (1) while the output of the circuit 100 is a logic low (0). As a result, the reset circuit 106 is turned off during the glitch 502, and the reset circuit 106 passes the output of the filter 104. When the input signal to the circuit 100 transitions back to the logic low (0), the input signal to the circuit 100 again matches the output of the circuit 100. At that time, the transistor 206 and the transistor 208 of the reset circuit 106 turn on and pull the output of the filter 104 to logic high (1) or the voltage of the voltage source (VDD).

Figure 6:
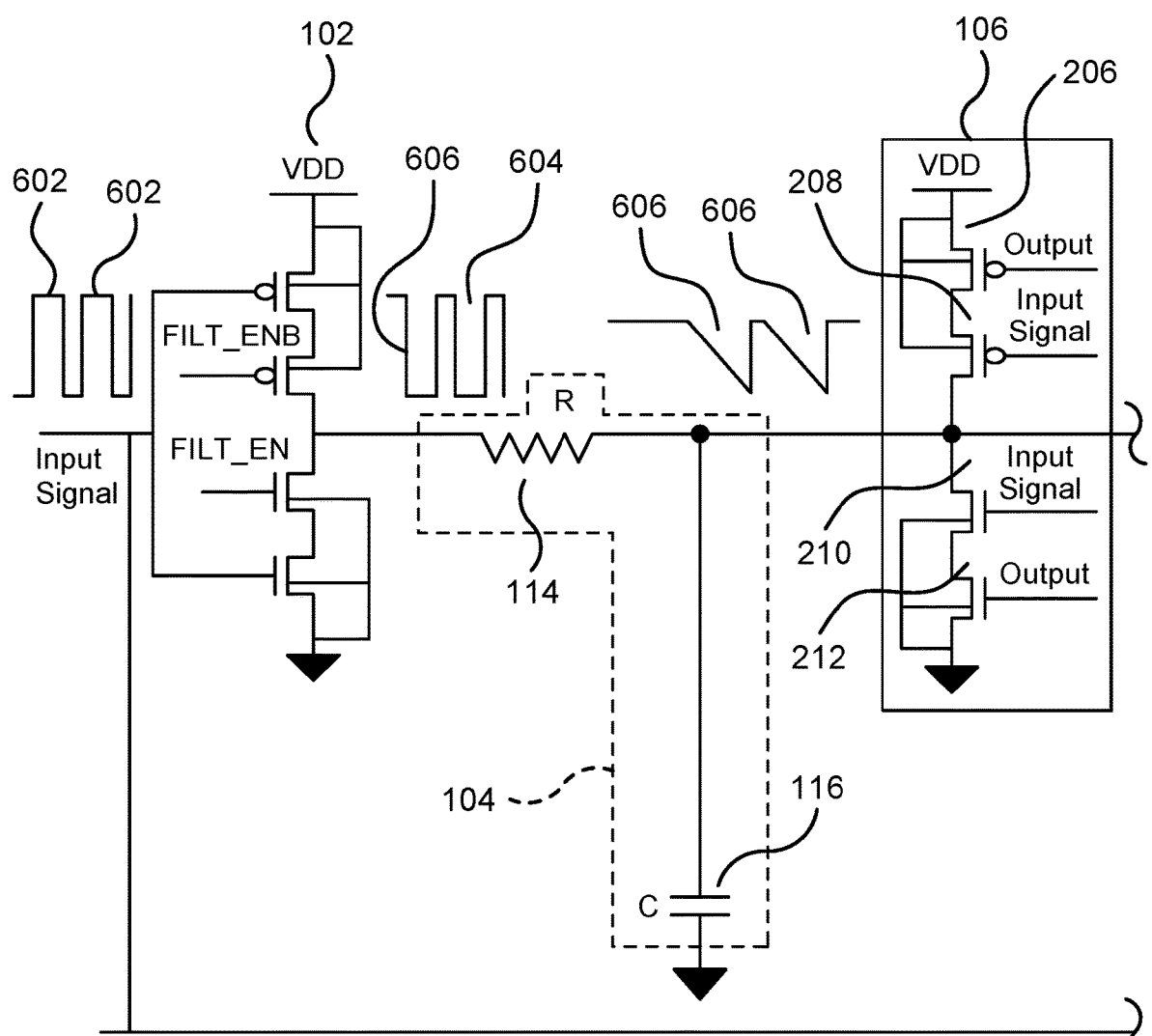
FIG. 6 illustrates continuous glitch filtering using the electric circuit of FIG. 1.
Figure 6:
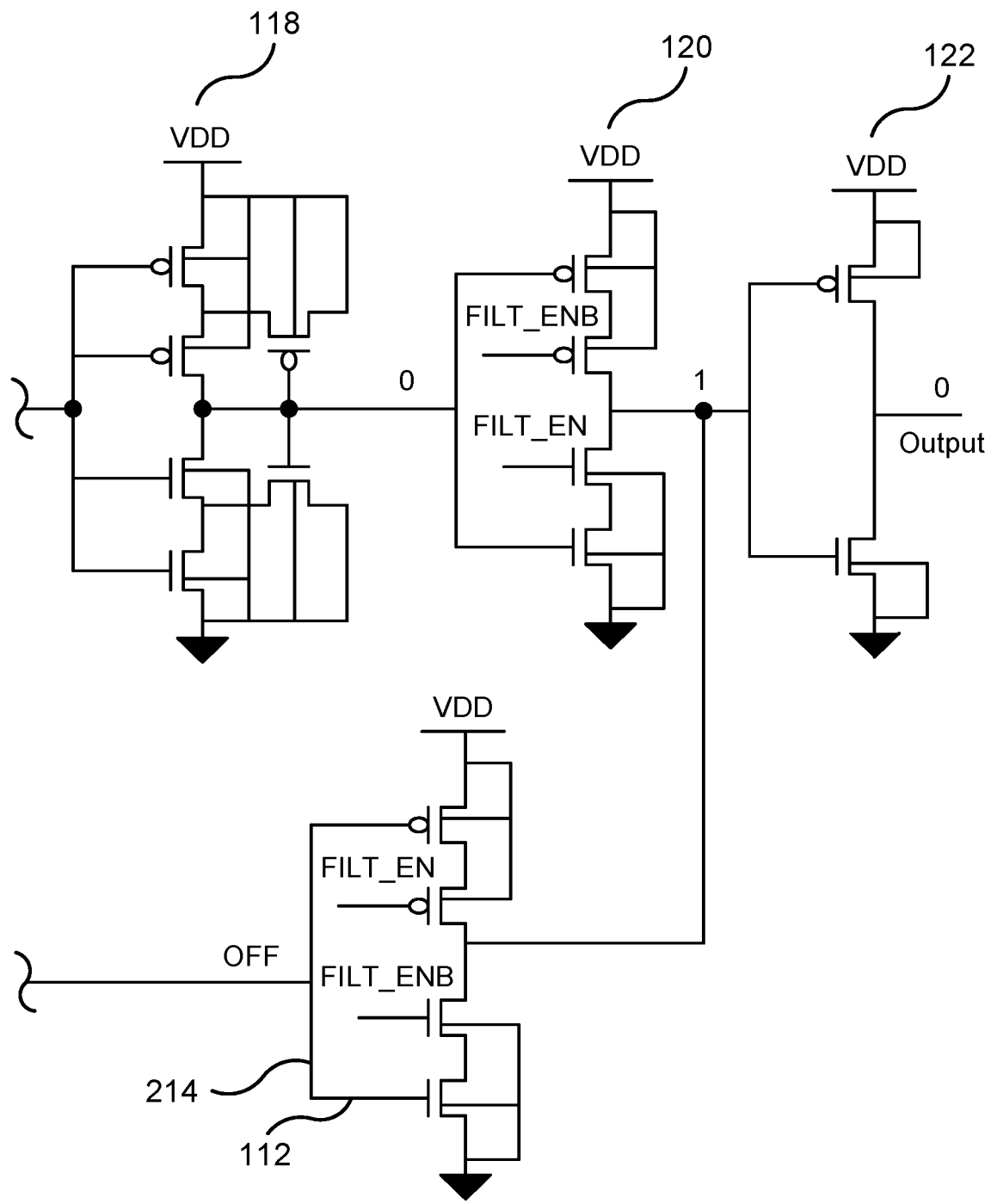

FIG. 6 illustrates continuous glitch filtering using the electric circuit 100 of FIG. 1. For clarity, the synchronizer circuit 108 has not been illustrated in FIG. 6, and the absence of the synchronizer circuit 108 in FIG. 6 should not be interpreted as the removal of the synchronizer circuit 108 from the electric circuit 100 in FIG. 6. As seen in FIG. 6, continuous glitch filtering may occur when the glitch filter is enabled (e.g., when FILT_EN=1 and FILT_ENB=0). When the glitch filter is enabled, the input inverter 102 and the inverter 120 are activated and the bypass inverter 214 is turned off.

In the example of FIG. 6, the input signal to the circuit 100 experiences a series of continuous glitches 602. Specifically, the input signal to the circuit 100 is a logic low (0) and then experiences several momentary transitions to logic high (1) and transitions back to the logic low (0). The input inverter 102 inverts the input signal to the circuit 100 to produce a logic high (1) that experiences a series of continuous glitches 604 that cause the signal to momentarily transition to logic low (0) and then transition back to logic high (1). Each of the glitches 604 causes the capacitor 116 to discharge, which causes a dip 606 in the output of the filter 104. The first dip 606 may not be sufficient to cause the inverter 118 to recognize a flip in the logic state of the output of the filter 104. As a result, the inverter 118 continues to see a logic high (1) as the output of the filter 104. The inverter 118 inverts the output of the filter 104 and produces a logic low (0). The inverter 120 inverts the output of the inverter 118 and produces a logic high (1). The inverter 122 inverts the output of the inverter 120 and produces a logic low (0) as the output of the circuit 100.

When the first glitch 602 occurs in the input signal to the circuit 100, the input signal to the circuit 100 is logic high (1) while the output of the circuit 100 is logic low. As a result, the reset circuit 106 is turned off and the reset circuit 106 passes the output of the filter 104, including the first dip 606 to the inverter 118. When the first glitch 602 ends and the input signal to the circuit 100 transitions back to logic low (0), the input signal to the circuit 100 and the output of the circuit 100 match. As a result, the transistor 206 and the transistor 208 turn on and pull the output of the filter 104 to logic high (1) or the voltage of the voltage source (VDD). As a result, the capacitor 116 charges. When the second glitch 602 occurs in the input signal to the circuit 100, the capacitor 116 may again discharge and cause a second dip 606 in the output of the filter 104. Because the capacitor 116 charged in between the glitches 602, the inverter 118 may not recognize a flip in the logic state of the output of the filter 104 when the second glitch 602 (or subsequent glitches 602) occurs. As a result, the inverter 118 may continue to produce a logic low (0). Thus, as seen in FIG. 6, the reset circuit 106 resets the state of the filter 104 in between continuous glitches 602 in the input signal to the circuit 100. As a result, the continuous glitches do not cause the capacitor 116 to discharge further and further so as to cause the output of the filter 104 to transition to another logic state.

Figure 7:
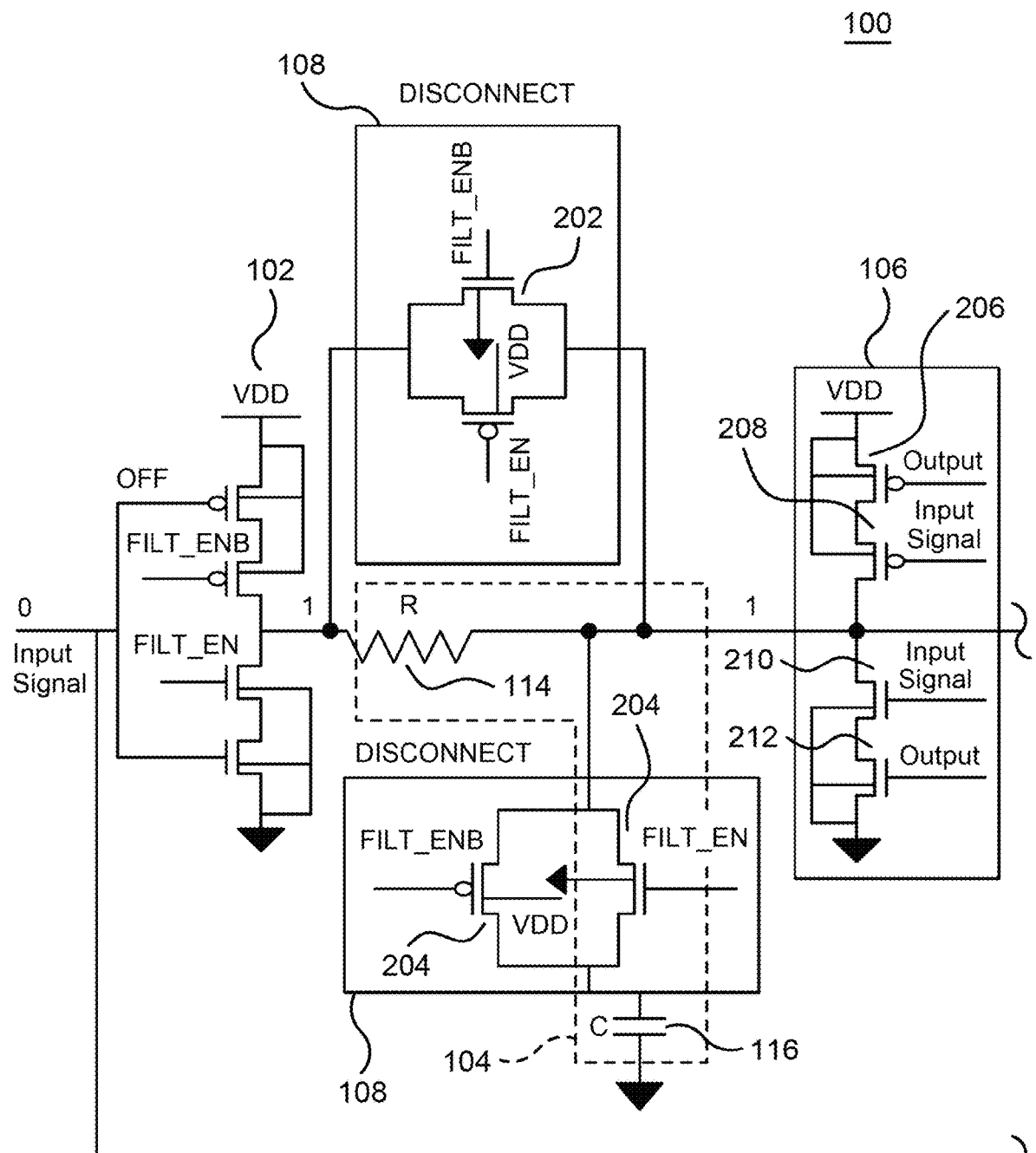
FIG. 7 illustrates a disabled mode of the electric circuit of FIG. 1.
Figure 7:
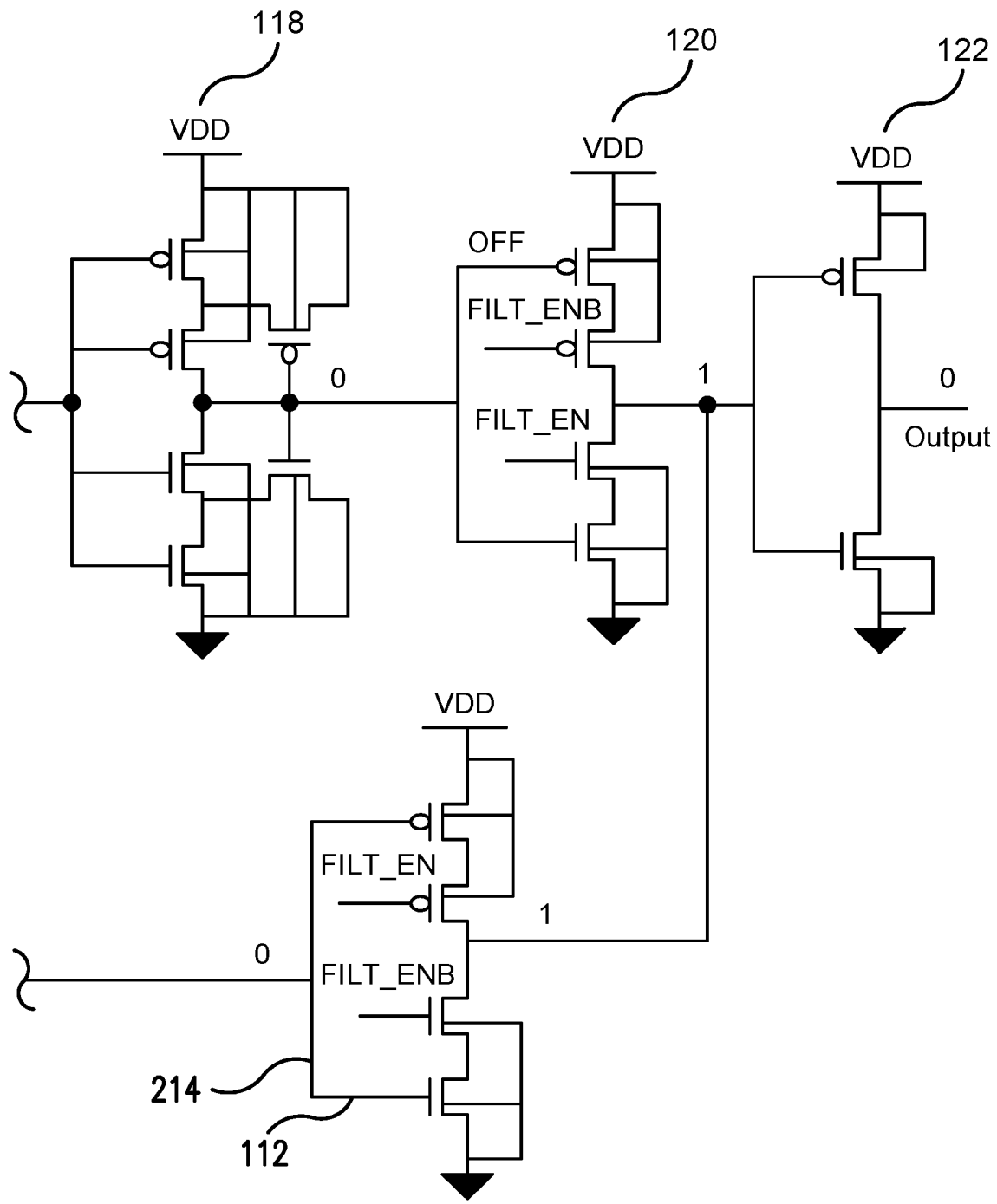
Figure 8:
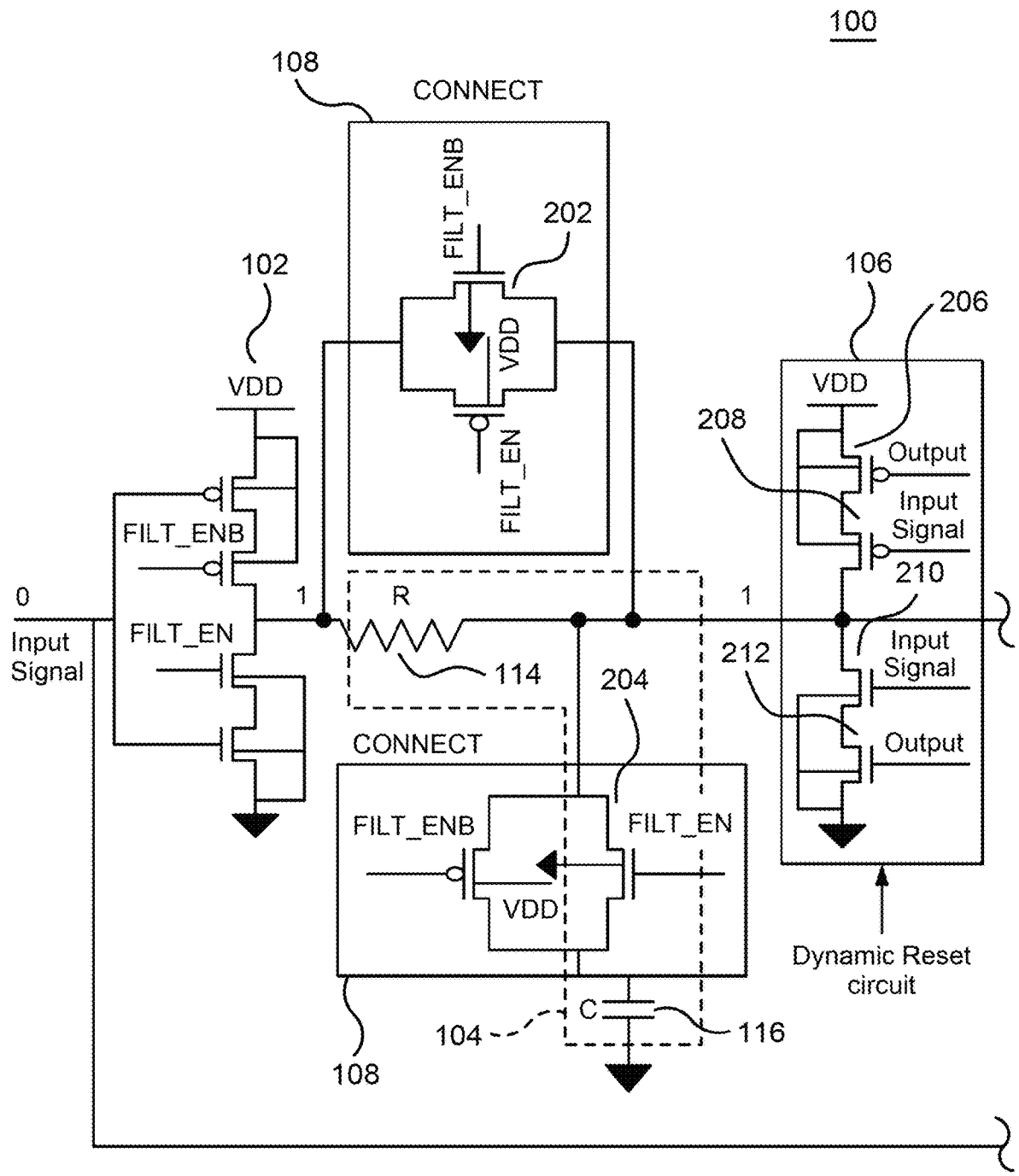
FIG. 8 illustrates an enabled mode of the electric circuit of FIG. 1.
Figure 8:
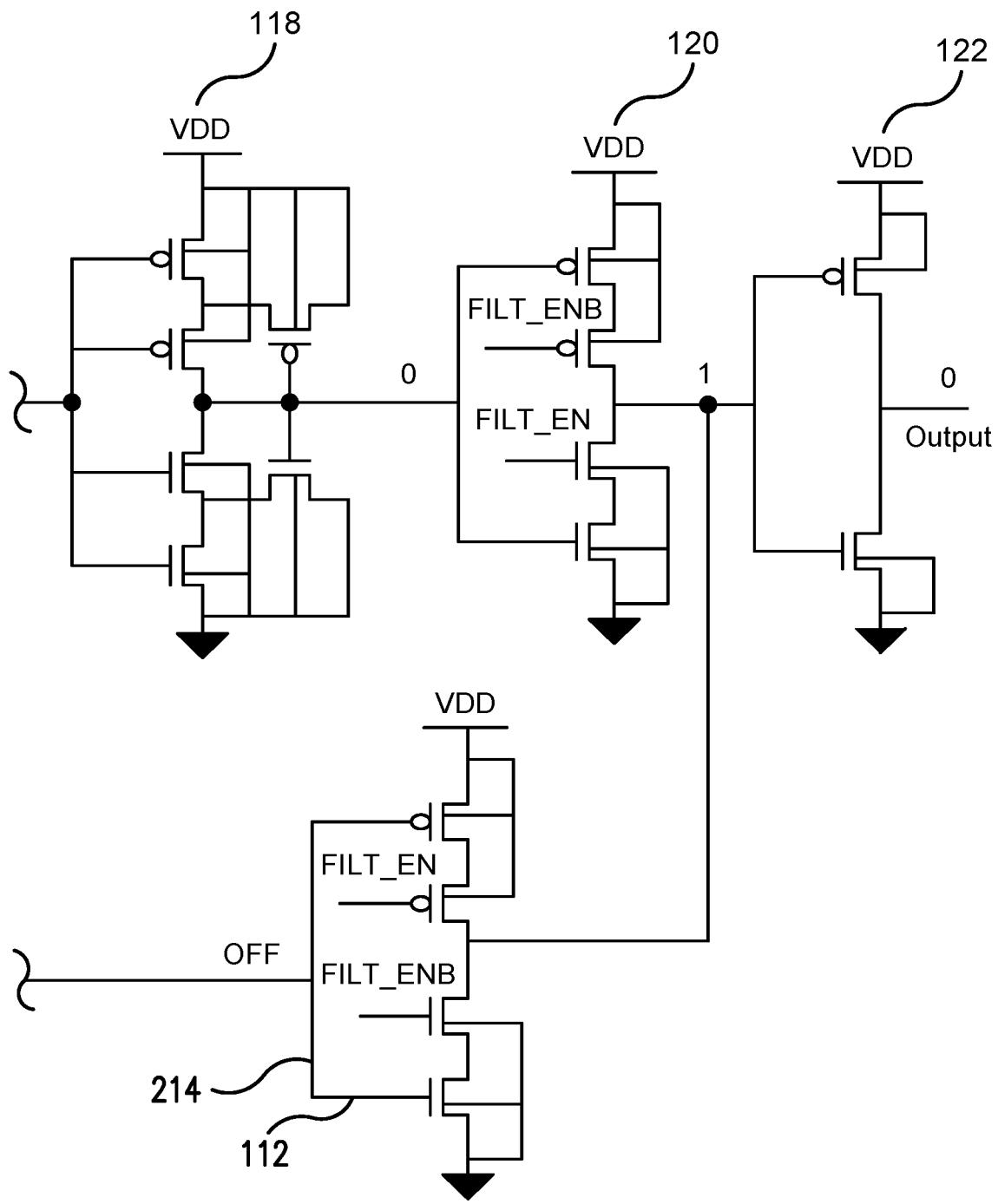

FIG. 7 illustrates a disabled mode of the electric circuit 100 of FIG. 1, and FIG. 8 illustrates an enabled mode of the electric circuit 100 of FIG. 1. Generally, the enabled mode shown in FIG. 8 may follow the disabled mode shown in FIG. 7. Thus, FIGS. 7 and 8 show the glitch filter transitioning from a disabled state to an enabled state.

As seen in FIG. 7, the glitch filter is disabled (e.g., FILT_EN=0 and FILT_ENB=1). The switches 202 and 204 of the synchronizer circuit 108 disconnect the resistor 114 and the capacitor 116 from the circuit 100. The input inverter 102 and the inverter 120 are turned off and become effectively open circuits. The bypass inverter 214 is active. As a result, the input signal to the circuit 100 travels through the bypass inverter 214. In the example of FIG. 7, the input signal to the circuit 100 is logic low (0). The bypass inverter 214 inverts the input signal to the circuit 100 and produces logic high (1). The inverter 122 inverts the output of the bypass inverter 214 to produce logic low (0), which is the output of the circuit 100.

Because the input signal to the circuit 100 and the output of the circuit 100 are both logic low (0), the transistors 206 and 208 of the reset circuit 106 turn on and pull the output of the filter 104 to logic high (1) or the voltage of the voltage source (VDD). The inverter 118 inverts the output of the filter 104 to produce logic low (0). Because the inverter 120 is turned off, the inverter 120 does not invert the output of the inverter 118.

As seen in FIG. 8, the circuit 100 transitions to an enabled state from the disabled state. When the circuit 100 transitions to an enabled state, the glitch filter is enabled (e.g., FILT_EN=1 and FILT_ENB=0). The switches 202 and 204 of the synchronizer circuit 108 connect the resistor 114 and the capacitor 116 to the circuit 100. The input inverter 102 and the inverter 120 are active, and the bypass inverter 214 is turned off and becomes effectively an open circuit.

The input inverter 102 inverts the input signal to the circuit 100 to produce logic high (1). At this point, the capacitor 116 begins to charge. Due to the charging, the output of the filter 104 may not transition to logic high (1) for a period of time. Because the input signal to the circuit 100 and the output of the circuit 100 are both logic low (0), the transistors 206 and 208 of the reset circuit 106 turn on and pull the output of the filter 104 to logic high (1) or the voltage of the voltage source (VDD). The inverter 118 inverts the output of the filter 104 to produce a logic low (0). The inverter 120 inverts the output of the inverter 118 to produce logic high (1). The inverter 122 inverts the output of the inverter 120 to produce logic low (0). As a result, the reset circuit 106 keeps the output of the filter 104 as logic high (1) while the capacitor 116 charges, and the output of the circuit 100 is kept consistent at the logic low (0). Thus, the reset circuit 106 prevents a glitch from occurring in the output of the circuit 100 while the capacitor 116 charges after the glitch filter transitions from a disabled state to an enabled state.

Figure 9:
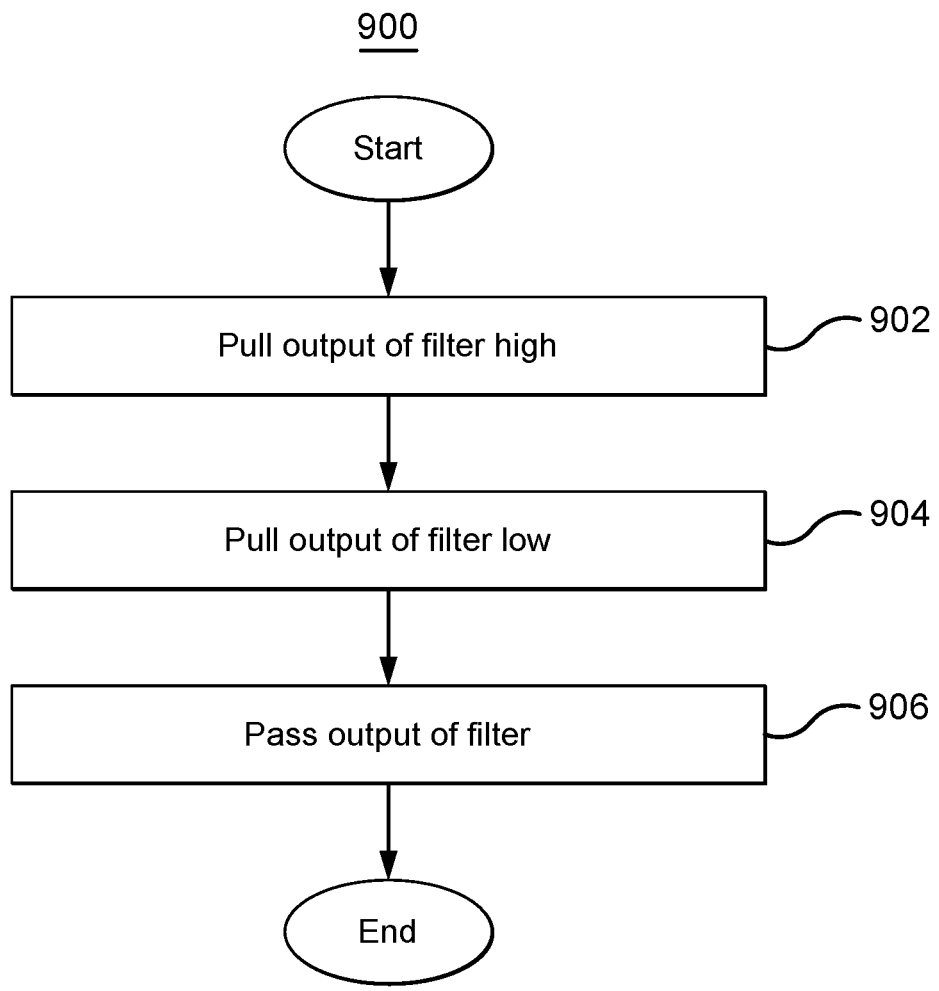
FIG. 9 is a flowchart of an example method performed in the electric circuit of FIG. 1.

FIG. 9 is a flowchart of an example method 900 performed in the electric circuit 100 of FIG. 1. In particular embodiments, the reset circuit 106 in the circuit 100 performs the method 900. By performing the method 900, the reset circuit 106 causes the circuit 100 to properly filter continuous glitches in the input signal to the circuit 100 and prevents a glitch from being introduced to the output of the circuit 100 when the circuit 100 transitions from a disabled state to an enabled state.

At 902, the reset circuit 106 pulls an output of the filter 104 to logic high (1). In particular embodiments, the transistors 206 and 208 of the reset circuit 106 turn on and pull the output of the filter 104 to logic high (1) when the input signal to the circuit 100 and the output to the circuit 100 are both logic low (0). This pulling of the output of the filter 104 to logic high (1) may occur in between continuous glitches in the input signal to the circuit 100. This pulling of the output of the filter 104 to logic high (1) may also occur when the glitch filter is disabled.

At 904, the reset circuit 106 pulls the output of the filter 104 to logic low (0). The transistors 210 and 212 of the reset circuit 106 may turn on and pull the output of the filter 104 to logic low (0) when the input signal to the circuit 100 and the output to the circuit 100 are both logic high (1). At 906, the reset circuit 106 passes the output of the filter 104. The reset circuit 106 may be turned off and pass the output of the filter 104 when the input signal to the circuit 100 and the output to the circuit 100 do not match. For example, the reset circuit 106 may pass the output of the filter 104, when one of the input signal to the circuit 100 or the output to the circuit 100 is logic high (1) and the other is logic low (0).

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the FIG.s and like elements are labeled with like numerals. The disclosure and drawings are, accordingly, to be regarded in an illustrative sense rather than a restrictive sense.

What is claimed is:

1. An electric circuit for filtering glitches, the electric circuit comprising:
   a filter;
   an inverter circuit electrically coupled to an output of the filter; and
   a reset circuit electrically coupled to the output of the filter, wherein the reset circuit is arranged to:
      pull the output of the filter high when an input signal to the electric circuit and the output of the inverter circuit are both low;
      pull the output of the filter low when the input signal to the electric circuit and the output of the inverter circuit are both high; and
      pass the output of the filter when (i) the input signal to the electric circuit is high and the output of the inverter circuit is low or (ii) the input signal to the electric circuit is low and the output of the inverter circuit is high.

2. The electric circuit of claim 1, further comprising a bypass inverter arranged to:
   invert the input signal to the electric circuit when the filter is disabled; and
   turn off when the filter is enabled.

3. The electric circuit of claim 2, wherein the inverter circuit comprises:
   a first inverter electrically coupled to the output of the filter;
   a second inverter electrically coupled to an output of the first inverter; and
   a third inverter electrically coupled to an output of the second inverter.

4. The electric circuit of claim 3, wherein an output of the bypass inverter is electrically coupled to the output of the second inverter.

5. The electric circuit of claim 3, wherein the second inverter is arranged to:
   invert the output of the first inverter when the filter is enabled; and
   turn off when the filter is disabled.

6. The electric circuit of claim 1, further comprising a synchronizer circuit arranged to:
   electrically disconnect the filter from the reset circuit when the filter is disabled; and
   electrically connect the filter to the reset circuit when the filter is enabled.

7. The electric circuit of claim 1, further comprising an input inverter arranged to:
   invert the input signal to the electric circuit when the filter is enabled, wherein the filter is electrically coupled to an output of the input inverter; and
   turn off when the filter is disabled.

8. A method for filtering glitches, the method comprising:
   pulling, by a reset circuit, an output of a filter high when an input signal and an output of an inverter circuit are both low, wherein the inverter circuit and the reset circuit are electrically coupled to the output of the filter;
   pulling, by the reset circuit, the output of the filter low when the input signal and the output of the inverter circuit are both high; and
   passing the output of the filter when (i) the input signal is high and the output of the inverter circuit is low or (ii) the input signal is low and the output of the inverter circuit is high.

9. The method of claim 8, further comprising:
   inverting, by a bypass inverter, the input signal when the filter is disabled; and
   turning off the bypass inverter when the filter is enabled.

10. The method of claim 9, wherein the inverter circuit comprises:
    a first inverter electrically coupled to the output of the filter;
    a second inverter electrically coupled to an output of the first inverter; and
    a third inverter electrically coupled to an output of the second inverter.

11. The method of claim 10, wherein an output of the bypass inverter is electrically coupled to the output of the second inverter.

12. The method of claim 10, further comprising:
    inverting, by the second inverter, the output of the first inverter when the filter is enabled; and
    turning off the second inverter when the filter is disabled.

13. The method of claim 8, further comprising:
    electrically disconnecting, by a synchronizer circuit, the filter from the reset circuit when the filter is disabled; and
    electrically connecting, by the synchronizer circuit, the filter to the reset circuit when the filter is enabled.

14. The method of claim 8, further comprising:
    inverting, by an input inverter, the input signal when the filter is enabled, wherein the filter is electrically coupled to an output of the input inverter; and
    turning off the input inverter when the filter is disabled.

* * * * *